United States Patent
Zhou et al.

(10) Patent No.: US 7,479,396 B2
(45) Date of Patent: Jan. 20, 2009

(54) STRUCTURE, SYSTEM AND METHOD FOR DIMENSIONALLY UNSTABLE LAYER DIMENSION MEASUREMENT

(75) Inventors: Lin Zhou, LaGrangeville, NY (US); Eric P. Solecky, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 11/290,737

(22) Filed: Nov. 30, 2005

(65) Prior Publication Data

US 2007/0124108 A1 May 31, 2007

(51) Int. Cl.
*H01L 21/00* (2006.01)
(52) U.S. Cl. ............... 438/14; 438/16; 257/E21.53
(58) Field of Classification Search .......... 438/5, 438/14, 16; 257/E21.53
See application file for complete search history.

(56) References Cited

U.S. PATENT DOCUMENTS

| 6,107,002 | A | 8/2000 | Holscher et al. |
| 6,635,405 | B1 | 10/2003 | Seniuk et al. |
| 6,774,044 | B2 | 8/2004 | Ke et al. |
| 2007/0212801 | A1* | 9/2007 | Kanno et al. ............ 438/14 |

* cited by examiner

*Primary Examiner*—Richard A. Booth
(74) *Attorney, Agent, or Firm*—Scully, Scott, Murphy & Presser, P.C.; H. Daniel Schnurmann

(57) ABSTRACT

A structure, a system and a method are directed towards determination of a dimension of a patterned dimensionally unstable layer when the dimension is measured using an apparatus that induces a variation of the dimension. The structure, system and method use a patterned dimensionally unstable layer pattern design that correlates with an algorithm used to determine the dimension when the dimension is measured using the apparatus that induces the variation of the dimension.

1 Claim, 2 Drawing Sheets

STRUCTURE, SYSTEM AND METHOD FOR DIMENSIONALLY UNSTABLE LAYER DIMENSION MEASUREMENT

BACKGROUND

1. Field of the Invention

The invention relates generally to dimensionally unstable layers, such as but not limited to photoresist layers, used for fabricating microelectronic structures. More particularly, the invention relates to patterned dimensionally unstable layers, such as patterned photoresist layers, used for fabricating microelectronic structures.

2. Description of the Related Art

Microelectronic structures are typically fabricated over substrates while using patterned photoresist layers as mask layers. The patterned photoresist layers typically mask portions of a substrate, frequently but not exclusively a semiconductor substrate, to allow for regioselective processing of other portions of the substrate. Non-limiting examples of regioselective processing include etch processing, deposition processing, plasma modification processing and ion implantation processing.

As microelectronic structure dimensions decrease, the dimensions of patterned photoresist layers used in their fabrication clearly must also decrease. In turn, as the dimensions of patterned photoresist layers decrease, a wavelength of energy needed for their photoexposure similarly also decreases. Such a decrease is generally required in order to avoid undesirable optical effects when photoexposing a blanket photoresist layer and forming a latent pattern therein. As a result, advanced photoresist materials are generally inherently more sensitive to higher energy (i.e., lower wavelength, such as, for example 193 nm) radiation sources.

One consequence of the enhanced sensitivity of advanced photoresist materials to higher energy radiation sources is that patterned photoresist layers comprised of those materials are often also inherently sensitive to higher energy radiation sources other than those used for their photoexposure. The sensitivity is often manifested as a shrinkage or dimensional variation of a patterned photoresist layer incident to exposure to higher energy radiation sources such as electron beam sources used for scanning electron microscopy linewidth measurement of the patterned photoresist layer. The shrinkage or dimensional variation may occur for patterned photoresist layers comprising various types of photoresist materials.

Typically, an absence of accurate and effective measurement of patterned photoresist layer linewidth generally leads to questionable quality control and quality assurance when fabricating microelectronic structures and devices. It may also lead to non-functional or unreliable microelectronic structures and devices.

Fortunately, methods for inhibiting shrinkage of patterned photoresist layers are known in the semiconductor fabrication art.

For example, Holscher et al., in U.S. Pat. No. 6,107,002 teaches a method for inhibiting shrinkage of a patterned photoresist layer comprising a positive photoresist material that also includes a photo-acid generator material. The method provides for photoactivating and neutralizing the photo-acid generator material prior to using the patterned photoresist layer as a reactive ion etch mask where it would otherwise shrink.

In addition, Ke et al., in U.S. Pat. No. 6,774,044, teaches a method for dimensionally stabilizing a patterned photoresist layer to inhibit shrinkage thereof incident to a scanning electron microscopy linewidth measurement thereof. The method provides for a plasma treatment of the patterned photoresist layer prior to the scanning electron microscopy linewidth measurement thereof.

Notwithstanding the foregoing disclosure, under certain alternative circumstances curing of a patterned photoresist layer using a plasma may induce a linewidth shrinkage during a curing process.

Also known in the semiconductor fabrication art are photoresist test structures that may be used incident to semiconductor device manufacturing and quality assurance.

In particular, Seniuk et al., in U.S. Pat. No. 6,635,405 teaches a patterned photoresist layer test structure that allows for decoupling of processing effects such as overexposure effects, underexposure effects and depth of focus effects. The test structure comprises a series of dimensionally progressing patterned photoresist layer dots and a correlating and complementary series of dimensionally progressing holes within an additional patterned photoresist layer.

Microelectronic structure dimensions and patterned photoresist layer dimensions are certain to decrease, and as a result thereof patterned photoresist layer sensitivity to higher energy radiation sources is also likely to increase. Desirable are structures and methods that allow for accurate determination of patterned photoresist layer dimensions in spite of dimensional sensitivity of patterned photoresist, layers to higher energy radiation sources.

SUMMARY OF THE INVENTION

The invention provides a patterned dimensionally unstable layer structure, a system for analyzing the structure and a method for analyzing the structure. The invention also includes a computer readable medium tangibly embodying a set of instructions to perform the method. In conjunction with appropriate supporting algorithms, the structure is useful for determining a patterned dimensionally unstable layer dimension while using a measurement apparatus that induces a variation of the patterned dimensionally unstable layer dimension.

Typically, each of the structure, the system and the method may be used for an in-line measurement of the patterned dimensionally unstable layer dimension. An "in-line measurement" is intended as a measurement that may be obtained directly within a manufacturing facility without appreciably impeding flow of work product within the manufacturing facility.

The patterned dimensionally unstable layer is typically a patterned photoresist layer, but the invention is not so limited. Rather, the patterned dimensionally unstable layer may comprise any of several dimensionally unstable materials. Non-limiting examples of dimensionally unstable materials may include appropriate conductor materials, semiconductor materials, dielectric materials, organic materials, inorganic materials and composite materials. Dimensional instability of a particular material to a particular measurement apparatus or technique is readily discerned by a person skilled in the art.

In addition, while the preferred embodiments of the invention contemplate dimensional instability of a patterned dimensionally unstable layer incident to a measurement thereof using a scanning electron microscopy apparatus, the invention is also not so limited. Other measurement apparatus that induce a dimensional variation within a dimensionally unstable layer are also within the context of the invention. Non-limiting examples include infrared, visible, ultraviolet, x-ray, thermal and mechanical measurement apparatus.

A structure in accordance with the invention comprises a patterned dimensionally unstable layer located over a substrate. It has a pattern design that correlates with an algorithm intended to determine a dimension of the patterned dimensionally unstable layer when the dimension is measured using an apparatus that induces a variation in the dimension.

A system in accordance with the invention comprises an apparatus that induces a variation in a dimension of a patterned dimensionally unstable layer when measuring the dimension. It also includes a computer programmed with an algorithm correlating with a patterned dimensionally unstable layer pattern design used to determine the dimension when the dimension is measured using the apparatus that induces the variation of the dimension.

A method in accordance with the invention comprises measuring a structure comprising a patterned dimensionally unstable layer while using an apparatus that induces a variation of a dimension of the patterned dimensionally unstable layer. It also comprises correlating a pattern design of the patterned dimensionally unstable layer with an algorithm used to determine the dimension when the structure is measured using the apparatus that induces the variation of the dimension. The method finally comprises executing the algorithm to determine the dimension.

The invention also includes a computer readable medium tangibly embodying a set of instructions readable and executable by a machine to perform the foregoing method steps for analyzing a patterned dimensionally unstable layer.

The invention and the embodiments contemplate that a structure in accordance with the invention is a patterned dimensionally unstable layer test structure, but the invention is not so limited. The invention also contemplates that a structure in accordance with the invention may also under certain circumstances be fabricated for functional purposes when dimensional variation (i.e., typically shrinkage) thereof does not compromise functional utility of the structure.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

The invention provides a patterned dimensionally unstable layer structure, a system for analysis thereof and a method for analysis thereof. The structure, system and method are directed towards accurate measurement of a dimension of a patterned dimensionally unstable layer when using an apparatus that induces a variation of the dimension. To that end, the structure, system and method use a patterned dimensionally unstable layer pattern design that correlates with an algorithm intended to determine the dimension when measured using the apparatus that induces the variation of the dimension.

Figure 1:
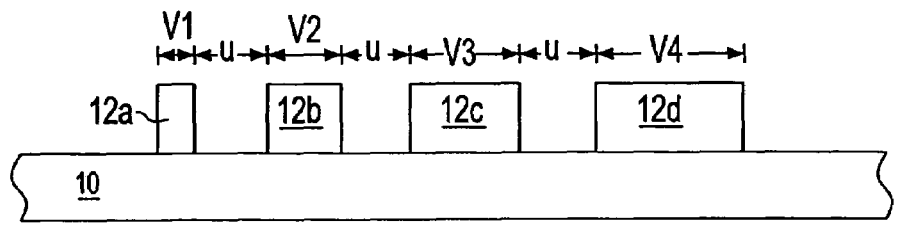
FIG. 1 shows a schematic cross-sectional diagram illustrating a first embodiment of a structure in accordance with the invention.

FIG. 1 shows a schematic cross-sectional diagram of a structure in accordance with a first embodiment of the invention.

FIG. 1 shows a substrate 10. A series of patterned dimensionally unstable layers 12a, 12b, 12c and 12d (i.e., most typically patterned photoresist layers) is located and formed upon the substrate 10.

The substrate 10 may include any of several substrates used within microelectronic fabrication. Non-limiting examples of such substrates include semiconductor substrates, ceramic substrates, reticle substrates, flat panel substrates and solar cell substrates. The invention is desirable within the context of semiconductor substrates. Semiconductor substrates may comprise any of several semiconductor materials. Non-limiting examples include silicon, germanium, silicon germanium alloy, silicon carbide, silicon germanium carbide alloy and compound (e.g., II-VI or III-V) semiconductor materials.

The embodiment also contemplates that the substrate 10 may comprise semiconductor or microelectronic devices that are connected and interconnected with patterned conductor layers that are separated by dielectric layers. The semiconductor or microelectronic devices may include, but are not limited to: transistors, resistors, diodes and capacitors. The patterned conductor layers often include, but are not limited to: metals (most typically but not exclusively copper and/or aluminum metals), metal alloys, metal nitrides and metal silicides. Dielectric layers may comprise materials including but not limited to: inorganic materials such as oxides, nitrides, oxynitrides; organic materials such as polymer materials; and composite materials of mixed inorganic composition and organic composition.

As noted above, the series of patterned dimensionally unstable layers 12a, 12b, 12c and 12d may comprise any of several materials, but in particular typically comprise photoresist materials. Non-limiting examples include positive, negative and hybrid photoresist materials. Although also not limiting, the embodiment and the invention generally provide greater advantage when the series of patterned dimensionally unstable layers 12a, 12b, 12c and 12d comprises either a positive photoresist material or (under certain defined circumstances) also a hybrid photoresist material. The advantage with respect to the foregoing two photoresist materials derives from the observation that patterned photoresist layers comprising positive photoresist materials and (under certain circumstances) also hybrid photoresist materials have not been photoexposed as a patterned photoresist layer comprised of a negative photoresist material would be.

As is illustrated in FIG. 1, each of the patterned dimensionally unstable layers 12a, 12b, 12c and 12d has a corresponding linewidth V1, V2, V3 or V4. The linewidths are intended as linearly increasing in a progression from patterned dimensionally unstable layer 12a to 12b to 12c and finally to 12d. Each of the series of patterned dimensionally unstable layers 12a, 12b, 12c and 12d is separated from an adjoining patterned dimensionally unstable layer 12a, 12b, 12c or 12d by a single separation distance (i.e., a space) U.

Although, as noted above, the invention is applicable to any of several substrates, the invention provides more practical value under circumstances where a measurement apparatus induced variation (i.e., typically shrinkage, but also potentially broadening) of a patterned dimensionally unstable layer pattern dimension comprises a significant dimensional portion of the patterned dimensionally unstable layer pattern dimension. Thus, it is desirable to design the series of patterned dimensionally unstable layers 12a, 12b, 12c and 12d as illustrated in FIG. 1 so that an anticipated measurement induced shrinkage of at least one of the series of patterned dimensionally unstable layers 12a, 12b, 12c or 12d is substantial within the context of its nominal or designed dimensions. To that end, since for example and without limitation patterned positive photoresist layer shrinkages may be anticipated to be in a range from about 5 to about 10 nanometers, a typical but not limiting progression of linewidths for the series of patterned dimensionally unstable layers 12a, 12b, 12c and 12d starts at about 10 nanometers for V1 and ends at about 40 nanometers for V4 in about 10 nanometer progressions and with a single separation distance U from about 10 to about 30 nanometers. The height dimensions of the series of patterned dimensionally unstable layers 12a, 12b, 12c and 12d do not vary. They are typically from about 1000 to about 15000 angstroms.

Figure 2:
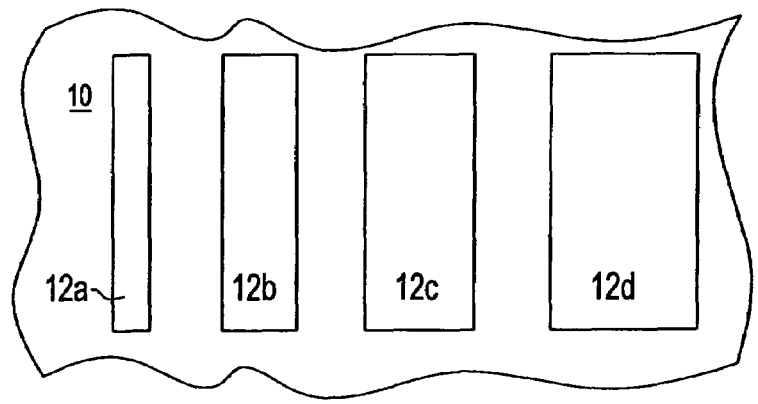
FIG. 2 shows a schematic plan-view diagram corresponding with the schematic cross-sectional diagram of FIG. 1.

FIG. 2 shows a schematic plan-view diagram corresponding with FIG. 1. FIG. 2 shows the substrate 10, along with the series of patterned dimensionally unstable layers 12a, 12b, 12c and 12d. FIG. 2 shows the series of patterned dimensionally unstable layers 12a, 12b, 12c and 12d typically comprising a discrete and independent test structure. The invention is not however, so limited. One or more of the series of patterned dimensionally unstable layers 12a, 12b, 12c and 12d may also be used for fabricating a functional microelectronic or semiconductor structure incident to further processing of the structure whose schematic cross-sectional diagram is illustrated in FIG. 2.

Figure 3:
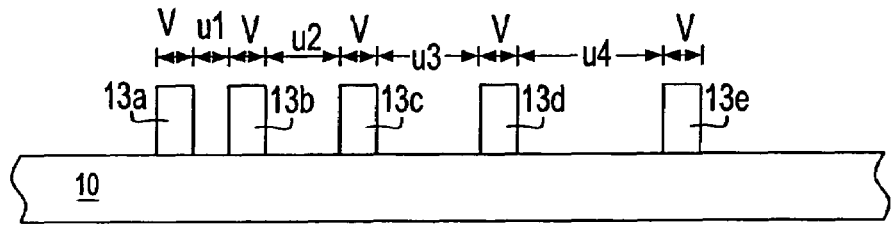
FIG. 3 and FIG. 4 show a pair of schematic cross-sectional diagrams illustrating two additional embodiments of two additional structures in accordance with the invention.
Figure 4:
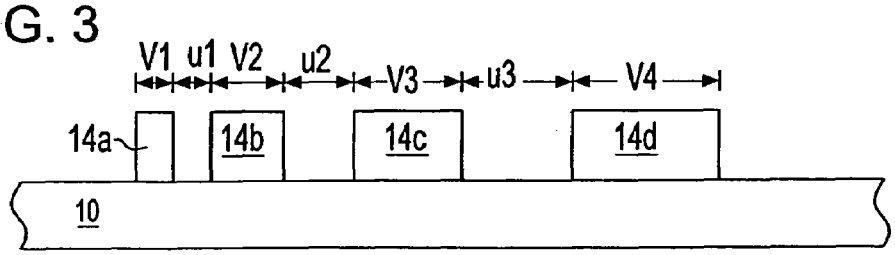

FIGS. 3 and 4 show a pair of schematic cross-sectional diagrams illustrating an additional pair of embodiments of a test structure in accordance with the invention.

The second embodiment of the test structure as illustrated in FIG. 3 correlates generally with the first embodiment of the test structure as illustrated in FIG. 1, insofar as both the first embodiment and the second embodiment use the same substrate 10. However, the second embodiment uses a series of patterned dimensionally unstable layers 13a, 13b, 13c, 13d and 13e each having a single linewidth V and being separated by progressive separation distances U1, U2, U3 and U4.

The third embodiment of the test structure as illustrated in FIG. 4 also correlates generally with the first embodiment of the test structure as illustrated in FIG. 1, and the second embodiment of the test structure as illustrated in FIG. 3, also insofar as the third embodiment uses the same substrate 10. In addition, it also combines features from the first embodiment and the second embodiment. It comprises a series of patterned dimensionally unstable layers 14a, 14b, 14c and 14d located and formed upon the substrate 10. The series of patterned dimensionally unstable layers 14a, 14b, 14c and 14d has a progressive series of linewidths V1, V2, V3 and V4 corresponding with the series of patterned dimensionally unstable layers 12a, 12b, 12c and 12d as illustrated in FIG. 1. It also has a progressive series of separation distances U1, U2 and U3 corresponding with the separation distances within the second embodiment as illustrated in FIG. 3.

The embodiments thus comprise a patterned dimensionally unstable layer comprising a series of lines and a series of spaces where at least one of: (1) the series of lines; and (2) the series of spaces, has a dimensional progression. Preferably, the dimensional progression is a linear dimensional progression. Also in accordance with the invention, and as will be illustrated in greater detail below, the series of lines and the series of spaces comprises a pattern design that correlates with an algorithm intended to determine a dimension of the patterned dimensionally unstable layer when the dimension is measured using an apparatus that induces a variation of the dimension.

The invention thus also requires a matching of a test structure and an algorithm that is predicated upon particular constraints of a patterned dimensionally unstable layer dimension variation.

Figure 5:
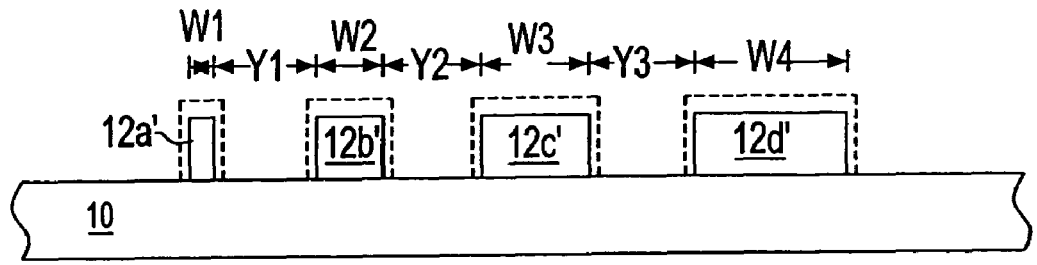
FIG. 5 and FIG. 6 show a pair of schematic cross-sectional diagrams illustrating two types of shrinkage of a patterned photoresist layer within a structure in accordance with the first embodiment of the invention.
Figure 6:
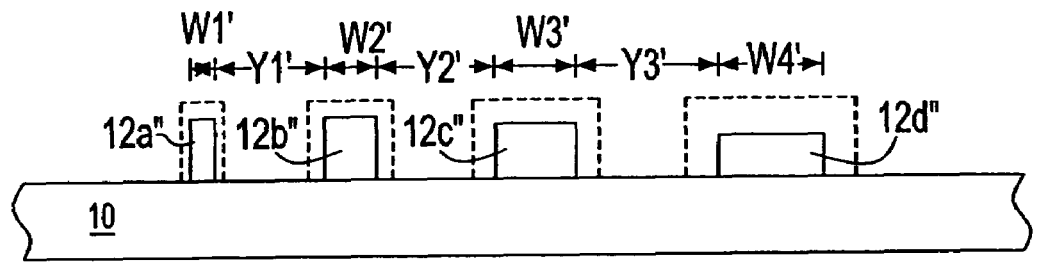

FIG. 5 and FIG. 6 show a pair of schematic cross-sectional diagrams illustrating possible measurement induced shrinkage profiles within the series of patterned dimensionally unstable layers 12a, 12b, 12c and 12d within the test structure of FIG. 1. Although FIG. 5 and FIG. 6 are thus directed towards the results of further processing (i.e., scanning electron microscopy linewidth dimensional measurement) of the test structure of FIG. 1, similar results are also expected for analogous further processing of the test structures of FIG. 3 and FIG. 4. Additional illustration of further processing of the test structures of FIG. 3 and FIG. 4 is not, however, illustrated.

FIG. 5 shows a series of shrunken patterned dimensionally unstable layers 12a', 12b', 12c' and 12d' that may result from dimensional measurement induced shrinkage of the series of patterned dimensionally unstable layers 12a, 12b, 12c and 12d as illustrated in FIG. 1. Within FIG. 5, the shrinkage is uniform in dimension with respect to each patterned dimensionally unstable layer 12a', 12b', 12c' or 12d'. Thus, a linewidth dimension of each of the series of patterned dimensionally unstable layers 12a, 12b, 12c and 12d as illustrated in FIG. 1 is reduced by twice the shrinkage layer thickness. In turn, twice the shrinkage layer thickness is incremented onto each of the separation distances U. As is illustrated in FIG. 5, each of the shrunken patterned dimensionally unstable layers 12a', 12b', 12c' and 12d' has a corresponding linewidth W1, W2, W3 or W4. Each of the separation distances has a corresponding spacewidth Y1, Y2 or Y3 that is a constant under uniform shrinkage conditions when the corresponding initial separations distances U are also constant.

FIG. 6 shows an additional series of shrunken patterned dimensionally unstable layers 12a", 12b", 12c" and 12d" that may alternatively result from dimensional measurement induced shrinkage of the series of patterned dimensionally unstable layers 12a, 12b, 12c and 12d as illustrated in FIG. 1. Within FIG. 6, the shrinkage is not uniform and independent of linewidth, but rather the shrinkage is proportional to the size of each of the patterned dimensionally unstable layers 12a, 12b, 12c or 12d. Within FIG. 6, each of the shrunken patterned dimensionally unstable layers 12a", 12b", 12c" and 12d" has a corresponding linewidth W1', W2', W3' or W4' and corresponding pairs of the foregoing shrunken patterned dimensionally unstable layers are separated by separation distances Y1', Y2' and Y3'.

The invention is intended to provide accurate patterned dimensionally unstable layer dimensional (i.e., typically linewidth) measurement notwithstanding patterned dimensionally unstable layer shrinkage illustrated within either FIG. 5 or FIG. 6. The invention does so by mating: (1) a test structure such as but not limited to the test structures of FIG. 1, FIG. 3 and FIG. 4; and (2) a measurement induced dimension variation such as but not limited to those illustrated in FIG. 5 and FIG. 6; with (3) an appropriate algorithm that calculates a virgin (i.e., unmeasured) patterned dimensionally unstable layer linewidth (and possibly also separation distance) from measured patterned dimensionally unstable layer dimensions (and possibly also separation distance dimensions) while considering measurement induced dimensional variation characteristics.

With respect to a patterned dimensionally unstable layer dimensional variation that comprises a constant amount of shrinkage independent of patterned dimensionally unstable layer linewidth (i.e., as illustrated in FIG. 5), the following analysis is appropriate. One first assumes in accordance with the test structure of FIG. 1 that the linewidths of the virgin patterned dimensionally unstable layers 12a, 12b, 12c and 12d are V1, V2, V3 and V4. They are related by design constants as follows: V1=K1V; V2=K2V; V3=K3V; and V4=K4V, where V is a linewidth desired to be determined and Kn (n=1, 2, 3, 4 . . . ) is a design coefficient line number. The design coefficients typically provide an increased and integrally incremented scaling of linewidths from V1 to V4. Typically, K1 equals one, and under such circumstances one thus wishes to determine the virgin linewidth V=V1 of the first patterned dimensionally unstable layer 12a in the series.

After linewidth measurement within an apparatus that induces linewidth variation as illustrated in FIG. 5, the resulting linewidths Wn (n=1, 2, 3, 4 . . . ) are W1=K1V−S; W2=K2V−S; W3=K3V−S; and W4=K4V−S, where S equals shrinkage.

In accordance with the above designations of dimensions, shrinkage, S, may in general be calculated as follows.

$$S=(Kn\,Wm-Km\,Wn)/(Km-Kn) \quad (1)$$

where n and m are intended to designate a particular pair of lines that may not necessarily be most closely adjacent.

In addition, the value of the linewidth V for the patterned dimensionally unstable layer desired to be determined may be calculated as follows.

$$V=(Wm-Wn)/(Km-Kn) \quad (2)$$

From a practical point of view, both patterned dimensionally unstable layer photolithographic methods and scanning electron microscopy measurement methods are susceptible to process and operational variations. Thus, a linear regression analysis is alternatively a desirable approach for analyzing shrunken patterned dimensionally unstable layer measurement data for a test structure in accordance with FIG. 1 and FIG. 5. A linear regression analysis of exemplary data is shown in FIG. 7.

Figure 7:
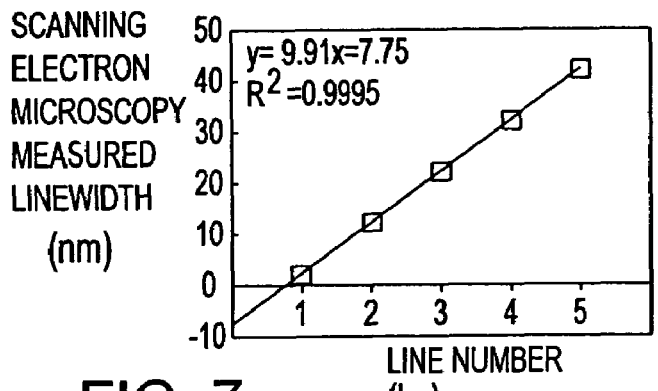
FIG. 7 shows a graph of Scanning Electron Microscopy Measured Linewidth versus Line Number for scanning electron microscopy measurement of a structure in accordance with the first embodiment of the invention as illustrated in FIG. 1 and FIG. 5.

FIG. 7 shows a hypothetical graph of Scanning Electron Microscopy Measured Linewidth versus Line Number for intended uniform dimensionally unstable shrinkage of a test structure as illustrated in FIG. 5. The series of measured linewidth data points is linearly regressed to yield a slope and an intercept. The slope corresponds with V (i.e., the linewidth of the feature desired to be measured) and intercept corresponds with the shrinkage S. As is shown in FIG. 7 for a nominal designed linewidth V1 equal to 10 nanometers, a calculated linewidth V is 9.91 nanometers. In addition, the intercept provides a shrinkage S of −7.75 nanometers. The statistical goodness of fit in designated as R squared. It has a value of 0.9995 indicative of a very good fit of the foregoing linear regression algorithm and the measured shrunken patterned dimensionally unstable layer data points.

While the foregoing exemplary analysis derives from the test structure of FIG. 1, a related analysis is also applicable with respect to the test structures of FIG. 2 or FIG. 3. The foregoing analysis merely requires that a test structure have at least one series of structures (i.e., either linewidths or separation distances) that linearly dimensionally vary.

Development of an algorithm that correlates with the patterned dimensionally unstable layer proportional shrinkage mechanism illustrated in the measured test structure of FIG. 6 is somewhat more complex. Nonetheless, a derivation still starts with the assumption that the widths of a series of incrementally increasing virgin patterned dimensionally unstable layers 12a, 12b, 12c and 12d as illustrated in FIG. 1 are V1, V2, V3 and V4. They may also be related to the linewidth V of a patterned dimensionally unstable layer desired to be measured as K1V, K2V, K3V and K4V. For the instant analysis, the series of patterned dimensionally unstable layers 12a, 12b, 12c and 12d of increasing linewidths is separated by a series of spaces of constant spacewidth U. Thus, the test structure of FIG. 1 is applicable to the instant analysis, but not the test structures of FIG. 3 or FIG. 4 since neither of them has a constant separation distance spacewidth U.

In general, subsequent to linewidth measurement the series of patterned dimensionally unstable layers again has a series of linewidths W1, W2, W3 and W4 (i.e., generally Wn, where n=1, 2, 3, 4 . . . ) and a series of spacewidths Y1, Y2, Y3 and Y4 (i.e., generally Yn, where n=1, 2, 3, 4 . . . ). In addition, any particular linewidth is related to linewidth proportional shrinkage coefficient B by the equation Wn=(1−B)Vn. In addition, the originally constant separation distances U between adjacent patterned dimensionally unstable layers become larger, but not linearly so. In accordance with the foregoing definitions, equations defining the proportional shrinkage coefficient B, the linewidth V and the constant separation distance U may be derived using the following mathematical methodology. One first defines measured widths of three successive lines Wn, Wn+1 and Wn+2, as well as the two intervening spaces Yn and Yn+1 as follows.

$$Wn=Vn-BVn=(1-B)Vn=KnV-BKnV \quad (3)$$

$$Wn+1=(1-B)Vn+1=Vn+1-BVn+1=Kn+1V-BKn+1V \quad (4)$$

$$Wn+2=(1-B)Vn+2=Vn+2-BVn+2=Kn+2V-BKn+2V \quad (5)$$

$$Yn=U+\tfrac{1}{2}(BVn+BVn+1)=U+\tfrac{1}{2}VB(Kn+Kn+1) \quad (6)$$

$$Yn+1=U+\tfrac{1}{2}(BVn+1+BVn+2)=U+\tfrac{1}{2}VB(Kn+1+Kn+2) \quad (7)$$

One may then derive: equation 8 as equation 3 plus two times equation 6; and equation 9 as equation 4 plus two times equation 7, as follows.

$$Wn+2Yn=KnV+2U+BVKn+1 \quad (8)$$

$$Wn+1+2Yn+1=Kn+1V+2U+BVKn+2 \quad (9)$$

One may then further derive: equation 10 as equation 4 plus equation 8; and equation 11 as equation 5 plus equation 9, as follows.

$$Wn+1+Wn+2Yn=(Kn+Kn+1)V+2U \quad (10)$$

$$Wn+2+Wn+1+2Yn+1=(Kn+1+Kn+2)V+2U \quad (11)$$

One may then finally further derive equation 12 as equation 10 minus equation 11 as follows.

$$Wn-Wn+2+2(Yn-Yn+1)=(Kn-Kn+2)V \quad (12)$$

The value of B derives directly from equation 3. The value of V derives directly from equation 12. The value of U derives directly from equation 6. They are as follows.

$$B=1-(Wn/(KnV))$$

$$V=(Wn-Wn+2)+2(Yn-Yn+1)/(Kn-Kn+2)$$

$$U=Yn-(0.5VB(Kn+Kn+1))$$

where:
  B=proportional shrinkage coefficient to be determined;
  V=linewidth to be determined;
  U=fixed separation distance to be determined;
  Yn=measured separation distance for space n, (n=1, 2, 3, 4 . . . );
  Yn+1=measured separation distance for space n+1;
  Wn=measured linewidth for patterned dimensionally unstable layer Kn;
  Wn+2=measured linewidth for patterned dimensionally unstable layer Kn+2;
  Kn=line number n, (n=1, 2, 3, 4 . . . );
  Kn+1=line number n+1; and
  Kn+2=line number n+2.

The foregoing analysis provides three equations and three unknown variables. A solution requires any set of four measured data points, including Wn, Wn+2, Yn and Yn+1.

As a hypothetical example, for Kn=2, Kn+1=3 and Kn+2=4, measured values of Wn =18 nanometers, Wn+2=36 nanometers, Yn=22.5 nanometers and Yn+1=23.5 nanometers would yield values of B=0.1, V=10 nanometers and U=20 nanometers.

The foregoing analyses are directed towards two examples that correlate with embodiments of the invention. One example assumes a linewidth independent constant shrinkage of a measured patterned dimensionally unstable layer and the other example assumes a linewidth dependent proportional shrinkage of a measured patterned dimensionally unstable layer.

The invention is limited to neither the embodiments of test structures as illustrated in FIGS. 1 and 3-4, nor the two correlating algorithmic examples above. Rather the invention also contemplates that alternative physical shrinkage characteristics of a measured patterned dimensionally unstable layer may be considered within the context of the invention. These alternative physical shrinkage characteristics may be evaluated within the context additional algorithms that in turn correlate with either the disclosed or alternatively designed test structures. Given an additional theoretical shrinkage mechanism for a patterned dimensionally unstable layer, a person skilled in the art could undertake analysis that leads to an appropriate algorithm that in turn leads to a particular test structure pattern design.

The invention also contemplates that the scanning electron microscopy measurement (or alternative measurement) aspects of any embodiment, and the algorithm analysis aspects of any embodiment, may be facilitated within the context of a computer assisted invention.

In that regard, the foregoing computer assisted aspects of the invention can take the form of an entirely hardware embodiment, an entirely software embodiment or an embodiment containing both hardware and software elements. In a preferred embodiment, the invention is implemented in software, which includes but is not limited to: firmware, resident software, microcode, etc.

Furthermore, some aspects of the invention can take the form of a computer program product accessible from a computer-usable or computer-readable medium providing program code for use by or in connection with a computer or any instruction executing system. For the purposes of this description, a computer usable or computer readable medium can be any apparatus that can contain, store, communicate, propagate, or transport the program for use by or in connection with the instruction execution system, apparatus or device.

The medium can be an electronic, magnetic, optical, electromagnetic, infrared or semiconductor system (or apparatus or device) or a propagation medium. Examples of computer readable medium include a semiconductor or solid state memory, magnetic tape, a removable computer diskette, a random access memory (RAM), a read only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 8:
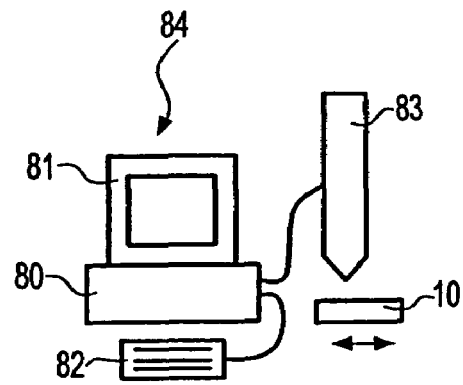
FIG. 8 shows a schematic diagram of a system in accordance with the invention.

FIG. 8 shows a schematic diagram of an integrated computer assisted system in accordance with the invention. The integrated computer assisted system includes a scanning electron microscope measurement apparatus 83 that is connected to a work station 84. The work station 84 comprises a processing unit 80, a graphical user interface 81 (i.e., a video terminal) and an input device 82 (i.e., a keyboard). As is illustrated in FIG. 8, a series of patterned dimensionally unstable layers (not shown) located upon a substrate 10 is measured while using the scanning electron microscopy apparatus 83. In accordance with the embodiments and examples above, appropriate algorithms may be stored in the processing unit 80 and automatically executed when patterned dimensionally unstable layer measured data is available.

The preferred embodiments and examples of the invention are illustrative of the invention rather than limiting of the invention. Revisions and modifications may be made to methods, materials, structures, dimensions and apparatus in accordance with the preferred embodiments and examples of the invention while still providing an embodiment or an example in accordance with the invention, further in accordance with the appended claims.

What is claimed is:

1. A method for analyzing a patterned photoresist layer comprising:
   providing a system comprising:
   an apparatus that induces a variation of a dimension of a patterned photoresist layer when measuring the dimension; and
   a computer programmed with an algorithm correlating with a patterned photoresist layer pattern design used to determine the dimension when the dimension is measured using the apparatus that induces the variation of the dimension, wherein said variation is independent of the dimension;
   measuring, within the system, a structure comprising the patterned photoresist layer pattern design, said pattern design structure comprising a multiplicity of lines separated by a multiplicity of spaces, where at least one of the multiplicity of lines and the multiplicity of spaces has a linear dimensional progression; and
   executing, at said computer, the algoritbm to determine the dimension, said algorithm is a linear regression algorithm:

$$Wn = V Kn - S$$

where: S=actual uniform shrinkage to be determined;
V=actual linewidth to be determined;
Wn=measured linewidth for patterned photoresist layer Kn; and
Kn=line number; and n is an integer number greater or equal to 1.

* * * * *